US008012773B2

(12) United States Patent
Hayakawa

(10) Patent No.: US 8,012,773 B2
(45) Date of Patent: Sep. 6, 2011

(54) METHOD FOR MANUFACTURING LIQUID DISCHARGE HEAD

(75) Inventor: Kazuhiro Hayakawa, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/769,146

(22) Filed: Apr. 28, 2010

(65) Prior Publication Data

US 2010/0317130 A1 Dec. 16, 2010

(30) Foreign Application Priority Data

Jun. 11, 2009 (JP) ................................. 2009-140151

(51) Int. Cl.
*H01L 21/302* (2006.01)

(52) U.S. Cl. ..................... 438/21; 216/27; 257/E21.214

(58) Field of Classification Search .................... 438/21; 216/27

See application file for complete search history.

(56) References Cited

U.S. PATENT DOCUMENTS 6,143,190 A 11/2000 Yagi et al.
6,555,480 B2 4/2003 Milligan et al.
6,875,365 B2 * 4/2005 Watanabe et al. ................. 216/2
7,063,799 B2 6/2006 Hayakawa et al.
7,250,113 B2 * 7/2007 Komuro et al. ................. 216/27
7,275,813 B2 10/2007 Ushijima et al.
7,300,596 B2 * 11/2007 Murayama et al. ............. 216/27
7,323,115 B2 1/2008 Hayakawa et al.
7,452,474 B2 11/2008 Komuro et al.
7,517,058 B2 4/2009 Hayakawa et al.
7,517,059 B2 4/2009 Hayakawa
7,637,013 B2 12/2009 Hayakawa
2008/0032073 A1 2/2008 Ushijima et al.
2008/0038882 A1 * 2/2008 Takechi et al. ................ 438/151
2008/0088674 A1 4/2008 Hayakawa
2008/0166475 A1 * 7/2008 Jeong et al. ................ 427/126.3
2008/0173616 A1 * 7/2008 Sakurai ........................... 216/27
2008/0309731 A1 * 12/2008 Saito et al. ...................... 347/63
2009/0065472 A1 3/2009 Asai et al.
2009/0160913 A1 6/2009 Hayakawa et al.
2009/0244198 A1 10/2009 Hayakawa et al.

FOREIGN PATENT DOCUMENTS

JP 10-181032 A 7/1998

* cited by examiner

*Primary Examiner* — Savitri Mulpuri
(74) *Attorney, Agent, or Firm* — Fitzpatrick, Cella, Harper & Scinto

(57) ABSTRACT

A method for manufacturing a liquid discharge head includes providing a first layer containing a metal nitride to at least a portion on one surface of a silicon substrate corresponding to a supply port; providing a second layer on the first layer, the second layer including any one of aluminum, copper, and gold, or an alloy thereof; etching a portion of the silicon substrate corresponding to the supply port by reactive ion etching in a direction from the reverse surface towards the one surface so that the etched region reaches the first layer; and removing a portion of the first layer corresponding to the supply port and then removing a portion of the second layer corresponding to the supply port, thus forming the supply port.

2 Claims, 4 Drawing Sheets

METHOD FOR MANUFACTURING LIQUID DISCHARGE HEAD

BACKGROUND OF THE INVENTION

1. Field of the Invention

The present invention relates to a method for manufacturing a liquid discharge head.

2. Description of the Related Art

As a method for manufacturing an ink jet recording head applied in an ink jet recording method (liquid jet recording method), which is a typical example of a liquid discharge head, U.S. Pat. No. 6,555,480 describes a method of forming ink supply ports that penetrate through a silicon substrate by reactive ion etching (RIE).

Moreover, US Patent Publication No. 2009/0065472 describes a method of using a layer of aluminum, which is metal, as an etch-stop layer at the time of forming supply ports on a silicon substrate by reactive ion etching and defining an opening shape in the aluminum layer. According to this method, it is considered that it enables the suppression of the occurrence of notching when silicon is etched by reactive ion etching.

However, when metals such as aluminum used for the stop layer are diffused into the silicon substrate, a void may be generated in the stop layer, and accordingly, etching resistance will be lost. Moreover, there is a concern that the RIE for forming the supply ports would not progress smoothly due to the aluminum diffused into the silicon substrate. As the reason for this, it is supposed to be because, although, for example, it is common to use fluorine gas such as $SF_6$ to perform reactive ion etching of silicon, aluminum will not etch with fluorine gas but will remain as aluminum fluoride. Since aluminum dissolves in an etching solution for crystal anisotropic wet etching of silicon, such a problem was not conceived of when wet etching was employed.

SUMMARY OF THE INVENTION

The present invention provides a method for manufacturing a liquid discharge head capable of forming liquid supply ports on a silicon substrate by dry etching with high precision and high yield.

According to an aspect of the present invention, there is provided a method for manufacturing a liquid discharge head including a silicon substrate having one surface, energy generation elements for generating energy used for discharging a liquid being provided at side of the one surface, and a supply port which is provided so as to penetrate through the one surface of the silicon substrate and a reverse surface of the one surface for supplying the liquid to the energy generation elements, the method comprising: providing a first layer containing a metal nitride to at least a portion on the one surface of the silicon substrate corresponding to the supply port; providing a second layer on the first layer, the second layer comprising any one of aluminum, copper, and gold, or an alloy thereof; etching a portion of the silicon substrate corresponding to the supply port by reactive ion etching in a direction from the reverse surface towards the one surface so that the etched region reaches the first layer; and removing a portion of the first layer corresponding to the supply port and then removing a portion of the second layer corresponding to the supply port, thus forming the supply port.

According to the aspect of the present invention, it is possible to provide a method for manufacturing a liquid discharge head capable of forming liquid supply ports on a silicon substrate by dry etching with high precision and high yield.

Further features of the present invention will become apparent from the following description of exemplary embodiments with reference to the attached drawings.

BRIEF DESCRIPTION OF THE DRAWINGS

FIGS. 2A, 2B, 2C, 2D and 2E are schematic cross-sectional views illustrating the first embodiment of the present invention.

DESCRIPTION OF THE EMBODIMENTS

Preferred embodiments of the present invention will now be described in detail in accordance with the accompanying drawings.

Hereinafter, exemplary embodiments of the present invention will be illustrated, and a method for manufacturing a liquid discharge head according to the present invention will be described. In the following description, although an ink jet recording head will be described as an application example of the present invention, the scope of application of the present invention is not limited to this, but the present invention can be applied to liquid discharge heads for manufacturing biochips and printing electronic circuits and the like. As an example of the liquid discharge head, a color filter manufacturing head may be mentioned in addition to the ink jet recording head.

Embodiment 1

Preferred embodiments of the present invention will now be described in detail in accordance with the accompanying drawings.

Figure 3:
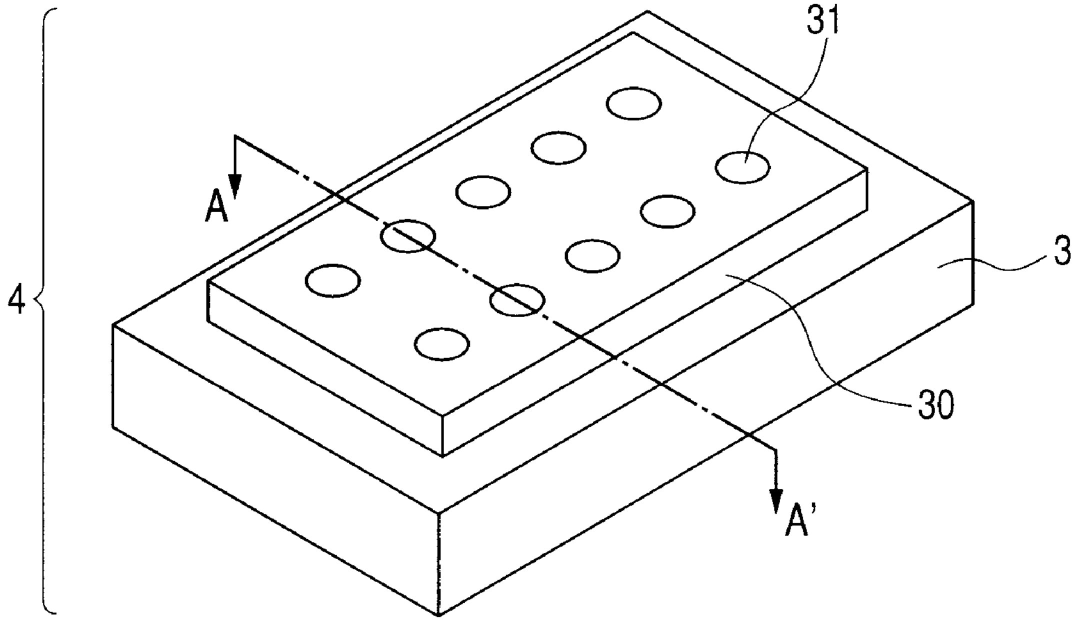
FIG. 3 is a schematic perspective view illustrating an ink jet recording head according to the first embodiment of the present invention.

FIG. 3 is a perspective view illustrating an example of an ink jet recording head according to the embodiments. An ink jet recording head 4 includes an ink jet recording head substrate 3 and a nozzle member 30 having discharge ports 31, which is provided thereon.

FIGS. 1A to 1D are sectional process views schematically illustrating the first embodiment of the present invention, and are cross-sectional views taken along the line A-A' in FIG. 3, where the line cuts the ink jet recording head perpendicular to the substrate.

In the present embodiment, by forming a barrier layer 12 before a stop layer is formed, it is possible to form the stop layer using metal such as aluminum that is easily diffused into a silicon substrate.

Figure 1A:
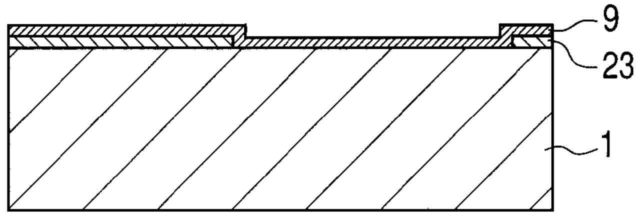
FIGS. 1A, 1B, 1C and 1D are schematic cross-sectional views illustrating a first embodiment of the present invention.

First, as illustrated in FIG. 1A, a material layer 9 for forming the barrier layer 12 which is the first layer, is provided on a silicon substrate 1 having an insulating film 23. The material layer 9 is formed of a material that is thermally stable so as not to be diffused, that is chemically stable and that has low specific resistance. As such a material, a metal nitride is preferably used, and more preferably, metal nitrides such as TaN, TiN, TaSiN, or WSiN are used.

Figure 1B:
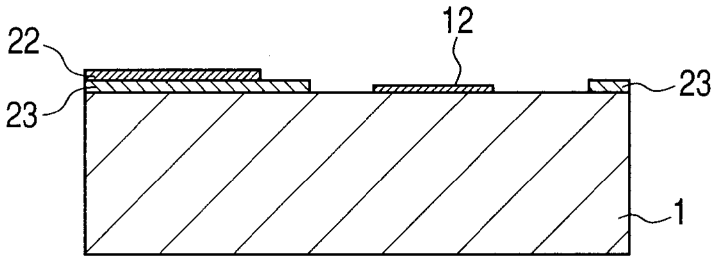

Subsequently, as illustrated in FIG. 1B, the material layer 9 is etched to form the barrier layer (first layer) 12 and a heat generating resistance layer 22 that constitutes a part of energy generation elements for generating energy used for discharging a liquid. A first layer containing a metal nitride is provided to at least a portion on the one surface of the silicon substrate corresponding to the supply ports.

The barrier layer 12 is formed of a material that is thermally stable so as not to be diffused, that is chemically stable and that has low specific resistance. As such a material, a metal nitride is preferably used, and more preferably, metal nitrides such as TaN, TiN, TaSiN, or WSiN are used. Moreover, the barrier layer has a thickness of 100 nm to 500 nm and has the stop layer of aluminum overlaid thereon and thus has a surface area of a certain width. Thus, the barrier layer has low electrical resistance, and accordingly, the charging of electric charges which causes notching does not occur.

Figure 1C:
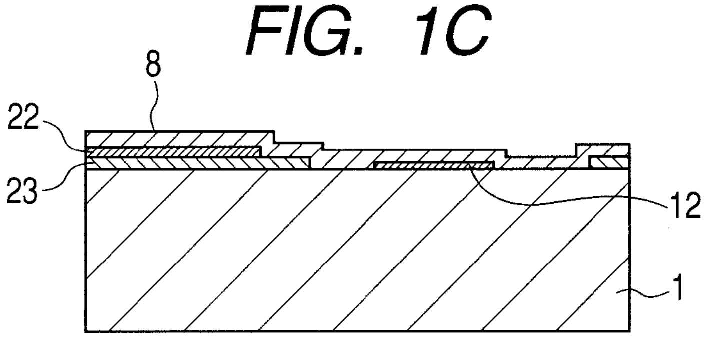

Subsequently, as illustrated in FIG. 1C, a conductive material layer 8 for forming a stop layer 10 which is the second layer is provided so as to cover the barrier layer 12 and the resistance layer 22.

Figure 1D:
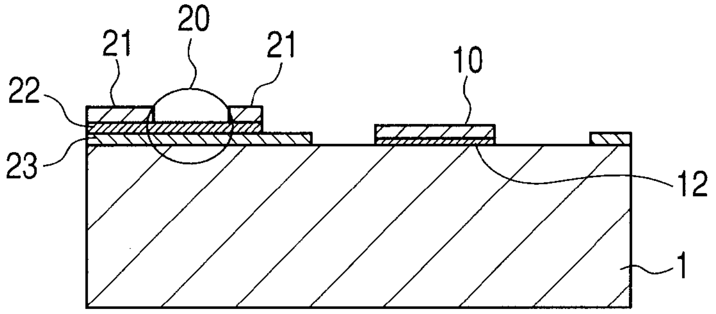

Subsequently, as illustrated in FIG. 1D, the conductive material layer 8 is etched so that the stop layer 10 and a wiring layer 21 are formed from the conductive material layer 8. A portion 20 of the resistance layer 22 corresponding to the gap between the wiring layers 21 serves as a portion that generates thermal energy.

The stop layer in the present invention has etching resistance against reactive ion etching performed in a subsequent process and consists of a conductive material. By forming the stop layer with a conductive material, the stop layer and the silicon substrate can be electrically connected during a subsequent reactive ion etching process. Thus, charging of electric charges can be reduced, and notching can be suppressed.

The conductive material constituting the stop layer is not particularly limited as long as it has a conductive property and etching resistance, and examples of such materials include aluminum, copper, and gold. Among them, aluminum is more preferable from the perspective of ease of later removal.

The stop layer can be formed, for example, by sputtering or vacuum deposition of these conductive materials.

Moreover, the stop layer is formed to be larger than an opening which is formed on the surface of the silicon substrate by a subsequent reactive ion etching process. That is to say, the stop layer is formed on the upper side of the opening on the surface of the silicon substrate formed by a subsequent reactive ion etching process and formed with a large surface area so as to cover the opening. Moreover, the stop layer of the present invention has an effect of controlling a CH distance (see FIG. 2E) which is the distance between an edge 2 of a supply port 33 close to a channel 7 and the central part of the energy generation portion 20.

The stop layer of the present invention is preferably configured to mainly contain aluminum as described above. However, when metals such as aluminum in the stop layer are diffused into the silicon substrate, there is a concern that a void is generated in the stop layer, and accordingly, etching resistance is lost. Moreover, aluminum that is diffused into the silicon substrate may cause etching defects during RIE for forming supply ports. A reason for this may be because, although, for example, it is common to use fluorine gas such as SF6 to perform reactive ion etching of silicon, for example, aluminum will not etch with fluorine gas but will remain as aluminum fluoride. Since aluminum dissolves in an alkali solution, such a problem did not arise in the conventional wet etching that uses an alkali solution. As another method of preventing diffusion of metals such as aluminum, the stop layer may be formed of an alloy such as an Al—Si film. However, there is a restriction in that if the concentration of Si is increased too much, Si may remain or be precipitated in a granular form when the stop layer is removed, thus leading to problems in the head quality. The present embodiment can solve such a problem.

Furthermore, according to the present embodiment, the barrier layer remains on the surface of the silicon substrate. For example, when the ink or liquid being discharged has alkalinity and thus has corrosiveness to silicon, the barrier layer protects the substrate. Particularly, although the corner portions in which the supply ports are opened are exposed to ink from a plurality of directions and are thus likely to be rapidly eroded, according to this embodiment, since the corner portions are exposed in one direction from a side surface thereof, the corner portions will not be rapidly eroded. According to the present embodiment, the above-mentioned effects can be obtained.

Figure 2A:
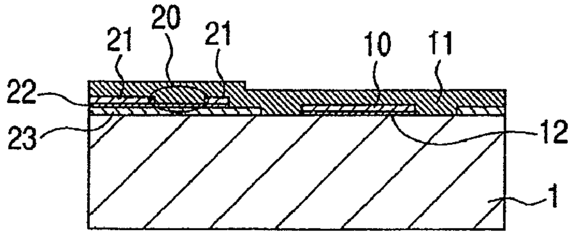

Subsequently, as illustrated in FIG. 2A, a protective layer 11 is formed so as to cover the stop layer 10. Moreover, the protective layer of the present invention has insulating properties and has resistance properties against removal of the stop layer. The protective layer may be substituted with an insulating layer for insulating the wiring layer or a single-layered or multi-layered passivation layer for protecting wirings or transistors from moisture.

Figure 2B:
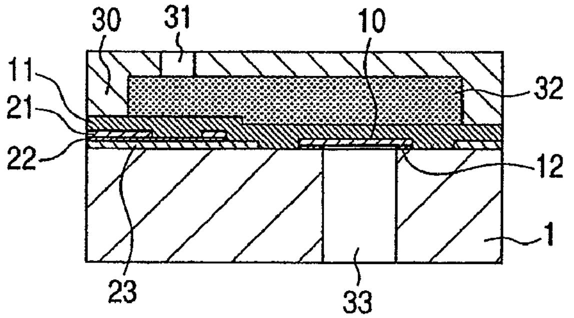

Subsequently, as illustrated in FIG. 2B, a channel mold 32 serving as a mold of an ink channel (liquid channel) is patterned, and a nozzle member 30 that constitutes the ink channel is formed thereon. Then, discharge ports are formed in the nozzle member 30. Thereafter, reactive ion etching is performed from the back surface of the substrate so as to reach the barrier layer 12, thus forming an ink supply port (liquid supply port) 33.

Here, the reactive ion etching of the present invention is not particularly limited, overall reactive ion etching (RIE) which is generally used as anisotropic dry etching may be used. As example of the RIE, CCP-RIE, ICP-RIE, and NLD-RIE can be mentioned. Among them, ICP-RIE is preferred. In particular, since ICP-RIE uses high-density plasma and is thus capable of effectively decomposing process gas, it is possible to obtain an advantage that high etching rate can be obtained. Moreover, a Bosch process may be used in which etching is performed while alternately introducing etching gas (e.g., $SF_6$) and deposition gas (e.g., $C_4F_8$) to form a protective film on sidewalls by the deposition gas.

The ink supply port 33 can be formed, for example, by masking the back surface of the substrate and then performing reactive ion etching.

Moreover, as described above, in the present invention, when the stop layer 10 is formed of a conductive film, since the stop layer is electrically connected to the substrate, charging of electric charges can be reduced, and notching can be suppressed. That is to say, in the RIE, ions having positive potential generated by plasma are irradiated to an etching target, and etching is performed using the energy thereof. At that time, the stop layer from which silicon which is the etching target is removed has insulating properties, and positive charges of the ions will remain there and be charged. When subsequent ions are irradiated further in this state, positive charges will repel each other, and accordingly, ions will move towards the sides, thus etching the side surfaces. This is the notching, and by making the stop layer conductive, the charging of the positive charges can be suppressed.

As illustrated in FIG. 2B, the etched region reaches the barrier layer 12, and the RIE is continued in such a state, whereby a part of the barrier layer 12 is removed to expose the stop layer 10. Moreover, the barrier layer 12 has an etching rate during the RIE, which is smaller than silicon and greater than the stop layer. Depending on the thickness of the barrier layer 12, there is a possibility that the stop layer 10 is not exposed at the point in time when the RIE stops. In such a case, the barrier layer 12 may be removed by chemical dry etching.

Figure 2C:
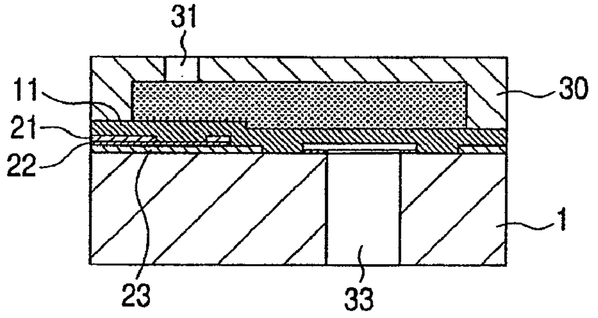

Subsequently, as illustrated in FIG. 2C, the stop layer 10 exposed to the ink supply port 33 is removed.

Although a method of removing the stop layer 10 is not particularly limited, when the stop layer is made of aluminum, the stop layer can be removed by dipping it in a mixed aqueous solution of phosphoric acid and nitric acid. At that time, the stop layer may be irradiated with ultrasonic waves or may be heated to a temperature of about 40 to 60° C. Moreover, a mixed solution of hydrogen peroxide and sulfuric acid may be used when the stop layer is made of copper, and a mixed solution of iodine and alkali iodide may be used when the stop layer is made of gold.

Figure 2D:
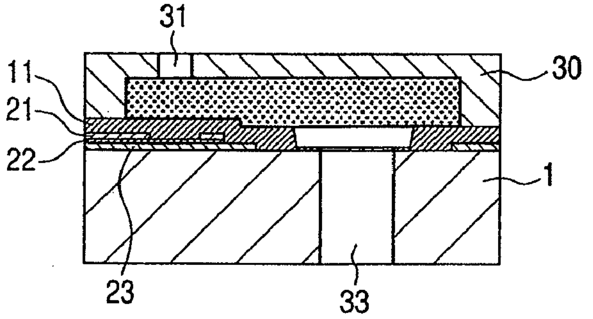
Figure 2D:
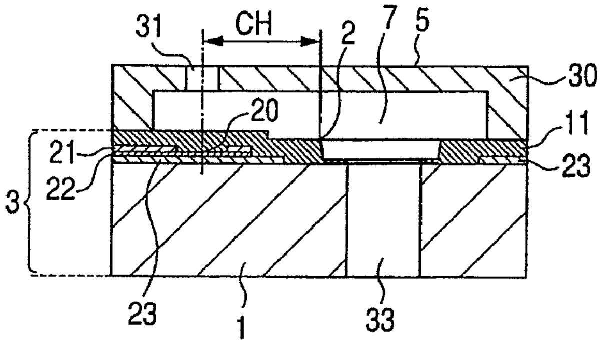

Subsequently, as illustrated in FIG. 2D, etching is performed through a space (the space in which the stop layer is removed) in which the ink supply port 33 and the stop layer 10 were present until the protective layer 11 is penetrated. By this process, the protective layer on the upper portion of the stop layer 10 is removed and opened. Therefore, by adjusting the size of the stop layer 10 being formed, it is possible to adjust the size of an upper opening of the ink supply port which is finally formed, and the CH distance can be controlled.

The etching is not particularly limited, but more specifically, etching gas or etching solution is introduced through the space in which the ink supply port 33 and the stop layer were present so that the protective layer portion disposed thereabove is etched and removed.

As the etching gas for etching the protective layer, when the protective layer is metal such as tantalum or silicon nitride, mixed gas of $CF_4$ and $O_2$ may be used, for example, which may be supplied in a state of being decomposed and excited by plasma. Moreover, as the etching solution, buffered fluorine acid may be used, for example, when the protective film is silicon oxide.

Lastly, as illustrated in FIG. 2E, the channel mold 32 is removed to form a channel 7, and as necessary, the nozzle member 30 is cured, whereby an ink jet recording head is manufactured.

Embodiment 2

Figure 4:
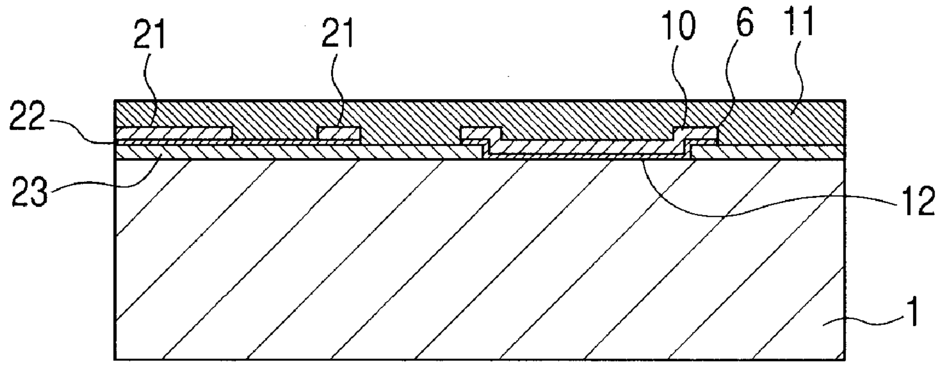
FIG. 4 is a schematic cross-sectional view illustrating a second embodiment of the present invention.

FIG. 4 is a sectional process view schematically illustrating a second embodiment of the present invention.

In the present embodiment, as illustrated in FIG. 4, in the process described with FIG. 2A in the first embodiment, before the stop layer 10 is formed, the barrier layer 12 is formed so that an end portion 6 of the pattern of the stop layer 10 and the barrier layer 12 is not disposed on the silicon substrate 1. With such a configuration, since metals such as aluminum in the stop layer do not easily diffuse into the silicon substrate, and a recess is hardly formed in the silicon when the barrier layer is patterned, the protective layer can be provided effectively. The processes later than this process may be performed similarly to those in the first embodiment.

EXAMPLE 1

Figure 5A:
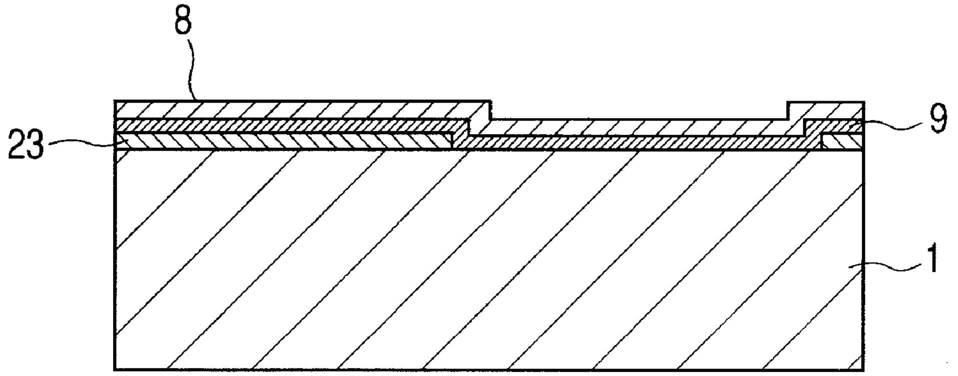
FIGS. 5A and 5B are cross-sectional views illustrating the manufacturing processes of an ink jet recording head taken along the same line as those illustrated in FIGS. 1A to 1D.
Figure 5B:
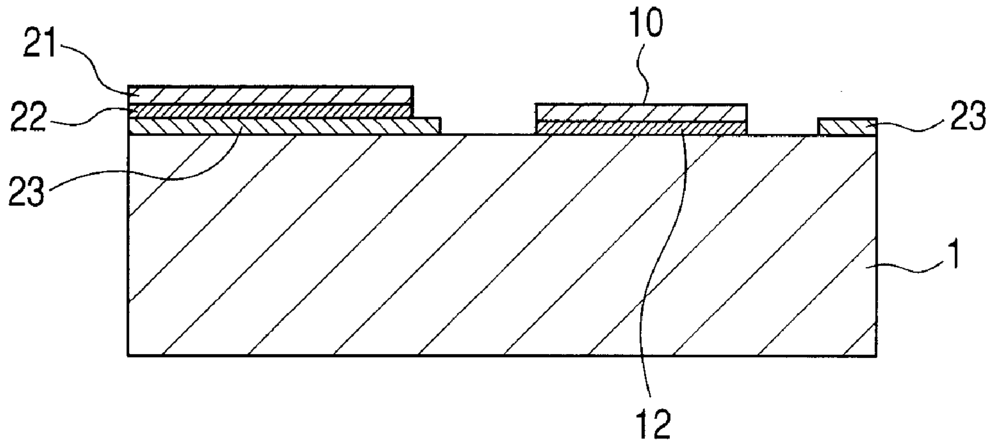

Next, examples will be illustrated, and the present invention will be described in more detail. FIGS. 5A and 5B will be referenced. FIGS. 5A and 5B are cross-sectional views illustrating the manufacturing processes of an ink jet recording head taken along the same line as those illustrated in FIGS. 1A to 1D.

First, a silicon oxide layer serving as a device separation layer of MOS (metal oxide semiconductor (not illustrated)) devices was formed on the surface of a single-crystalline silicon wafer. Furthermore, a BPSG (Boron Phosphor Silicate Glass) was formed thereon and patterned. Furthermore, a silicon oxide film was overlaid thereon by a plasma CVD method and patterned, whereby an insulating layer 23 was formed. A material layer 9 consisting of TaSiN was provided thereon (FIG. 1A).

Subsequently, a conductive material layer 8 was provided on the material layer 9. Specifically, an Al—Cu film was formed (FIG. 5A).

Subsequently, the material layer 9 and the conductive material layer 8 were collectively patterned to form a barrier layer 12 and a stop layer 10. This patterning was performed by RIE, and chlorine gas was used. Furthermore, a resistance layer 22 and a wiring layer 21 were also collectively formed.

During these series of processes, MOS devices were formed by a general semiconductor process, and a driving circuit for driving an energy generation element was formed (FIG. 5B).

Furthermore, the wiring layer 21 was partially removed to form a gap, and an energy generation portion 20 was formed (FIG. 1D).

Subsequently, a silicon nitride film was formed on the stop layer 10 and the wiring layer 21 by a plasma CVD method, and a protective layer 11 was formed (FIG. 2A).

Subsequently, a channel mold 32 serving as a mold of an ink channel was formed on the protective layer 11. As a material of the channel mold 32, a resin mainly composed of polymethyl isopropenyl ketone was used. The resin was solvent-coated on the protective layer 11 and was then patterned by photolithographic technique, whereby a channel mold 32 was formed. Subsequently, a nozzle member was formed on the channel mold 32. As a material of the nozzle member, a cation-polymerizable epoxy-based photoresist was used. The resist was deposited on the channel mold 32, and a discharge port 31 was formed by photolithographic technique, and the resist was then patterned so as to expose an external electrode (not illustrated). Subsequently, a general positive resist was deposited on the back surface of the silicon substrate 1, and positioning was achieved using alignment marks on the top side (nozzle surface side). Then, the positions of the supply ports on the back surface were subjected to exposure and development so that the silicon was exposed. Thereafter, reactive ion etching was performed up to the stop layer by RIE. At that time, a Bosch process was used in which $SF_6$ and $C_4F_8$ gases were alternately introduced, and etching and deposition steps were repeated (FIG. 2B).

Subsequently, the stop layer 10 exposed to the inside of the supply port was removed by dipping it in a mixed solution of nitric acid and acetic acid (FIG. 2C).

Subsequently, the protective layer 11 consisting of the silicon nitride film exposed to the inside of the supply port was removed by a mixed gas of $CF_4$ and $O_2$ by chemical dry etching (CDE). In this way, by partially removing the protective layer, the supply port was penetrated (FIG. 2D).

Subsequently, the channel mold 32 was removed using methyl lactate, and an ink jet recording head was manufactured (FIG. 2E).

The ink jet recording head was cut into chips from the wafer by a dicer, the chips were bonded to a tank, and the external electrode can be connected to a printer body.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-140151, filed Jun. 11, 2009, which is hereby incorporated by reference herein in its entirety.

What is claimed is:

1. A method for manufacturing a liquid discharge head including a silicon substrate having one surface, energy generation elements for generating energy used for discharging a liquid being provided at a side of the one surface, and a supply port which is provided so as to penetrate through the one surface of the silicon substrate and a reverse surface of the one surface for supplying the liquid to the energy generation elements, the method comprising:

providing a first layer containing a metal nitride to at least a portion on the one surface of the silicon substrate corresponding to the supply port;

providing a second layer on the first layer, the second layer comprising any one of aluminum, copper, and gold, or an alloy thereof;

etching a portion of the silicon substrate corresponding to the supply port by reactive ion etching in a direction from the reverse surface towards the one surface so that the etched region reaches the first layer;

removing a portion of the first layer corresponding to the supply port and then removing a portion of the second layer corresponding to the supply port, thus forming the supply port; and forming a material layer comprising materials including the metal nitride for forming the first layer on the one surface of the silicon substrate, so that the first layer and a heat generation layer for generating thermal energy used as the energy are formed from the material layer, wherein the metal nitride is selected from the group consisting of TaSiN and WSiN.

2. The method according to claim 1, wherein the second layer comprises an alloy of aluminum and copper.

* * * * *